(12) United States Patent
Mick, Jr et al.

(10) Patent No.: US 7,120,733 B1
(45) Date of Patent: Oct. 10, 2006

(54) CAM-BASED SEARCH ENGINES HAVING PER ENTRY AGE REPORTING CAPABILITY

(75) Inventors: John R. Mick, Jr, Sunnyvale, CA (US); Harmeet Bhugra, San Jose, CA (US); Jakob Saxtorph, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 325 days.

(21) Appl. No.: 10/714,680

(22) Filed: Nov. 14, 2003

Related U.S. Application Data

(63) Continuation-in-part of application No. 10/698,246, filed on Oct. 31, 2003.

(60) Provisional application No. 60/516,178, filed on Oct. 31, 2003.

(51) Int. Cl.
*G06F 12/12* (2006.01)

(52) U.S. Cl. .................................. 711/108
(58) Field of Classification Search ............. 711/108; 707/10, 102; 709/223, 224; 370/403, 469
See application file for complete search history.

(56) References Cited

U.S. PATENT DOCUMENTS

| | | | | |
|---|---|---|---|---|
| 5,329,618 | A * | 7/1994 | Moati et al. ............... | 709/245 |
| 5,917,821 | A | 6/1999 | Gobuyan et al. | |
| 6,108,702 | A * | 8/2000 | Wood ....................... | 709/224 |
| 6,154,462 | A * | 11/2000 | Coden ...................... | 370/403 |
| 6,219,748 | B1 | 4/2001 | Srinivasan et al. | |
| 6,226,710 | B1 * | 5/2001 | Melchior ................... | 711/108 |
| 6,240,485 | B1 | 5/2001 | Srinivasan et al. | |
| 6,331,985 | B1 * | 12/2001 | Coden ....................... | 370/403 |
| 6,405,248 | B1 * | 6/2002 | Wood ........................ | 709/223 |
| 6,424,659 | B1 * | 7/2002 | Viswanadham et al. ..... | 370/469 |
| 6,535,491 | B1 | 3/2003 | Gai et al. .................. | 370/256 |
| 6,564,289 | B1 | 5/2003 | Srinivasan et al. | |
| 6,570,877 | B1 | 5/2003 | Kloth et al. | |
| 6,574,701 | B1 | 6/2003 | Krishna et al. | |
| 6,614,676 | B1 | 9/2003 | Kaganoi | |
| 6,629,099 | B1 * | 9/2003 | Cheng ........................ | 707/10 |
| 6,633,835 | B1 | 10/2003 | Moran et al. | |
| 6,772,301 | B1 | 8/2004 | Cheng et al. ............... | 711/159 |
| 6,934,797 | B1 * | 8/2005 | Regev et al. ............... | 711/108 |
| 2003/0110180 | A1 * | 6/2003 | Calvignac et al. .......... | 707/102 |

OTHER PUBLICATIONS

IDT, "Design High-Speed Intelligent Packet-Processing Eqeupment in Less Time", Oct. 2002.*
IDT, "4.5M and 9M Network Search Engine (NSE) with LA-1 Interface Product Brief IDT75K52134 IDT75K62134", Jan. 2003.*
IDT, "Network Search Engine Development Board for the Intel IXDP2400 Development Platform Product Brief 75KTA062134-200", May 2003.*

* cited by examiner

*Primary Examiner*—Pierre Bataille
*Assistant Examiner*—Paul Schlie
(74) *Attorney, Agent, or Firm*—Myers Bigel Sibley & Sajovec PA

(57) ABSTRACT

Integrated search engine devices include a content addressable memory (CAM) core that is configured to support at least one database of searchable entries therein and a control circuit. The control circuit is configured to support reporting to a command host of data identifying entries that have been aged out of the at least one database and/or entries that have exceeded an activity-based aging threshold. The control circuit is further configured to support age reporting that is programmable on a per entry basis within the at least one database.

6 Claims, 11 Drawing Sheets

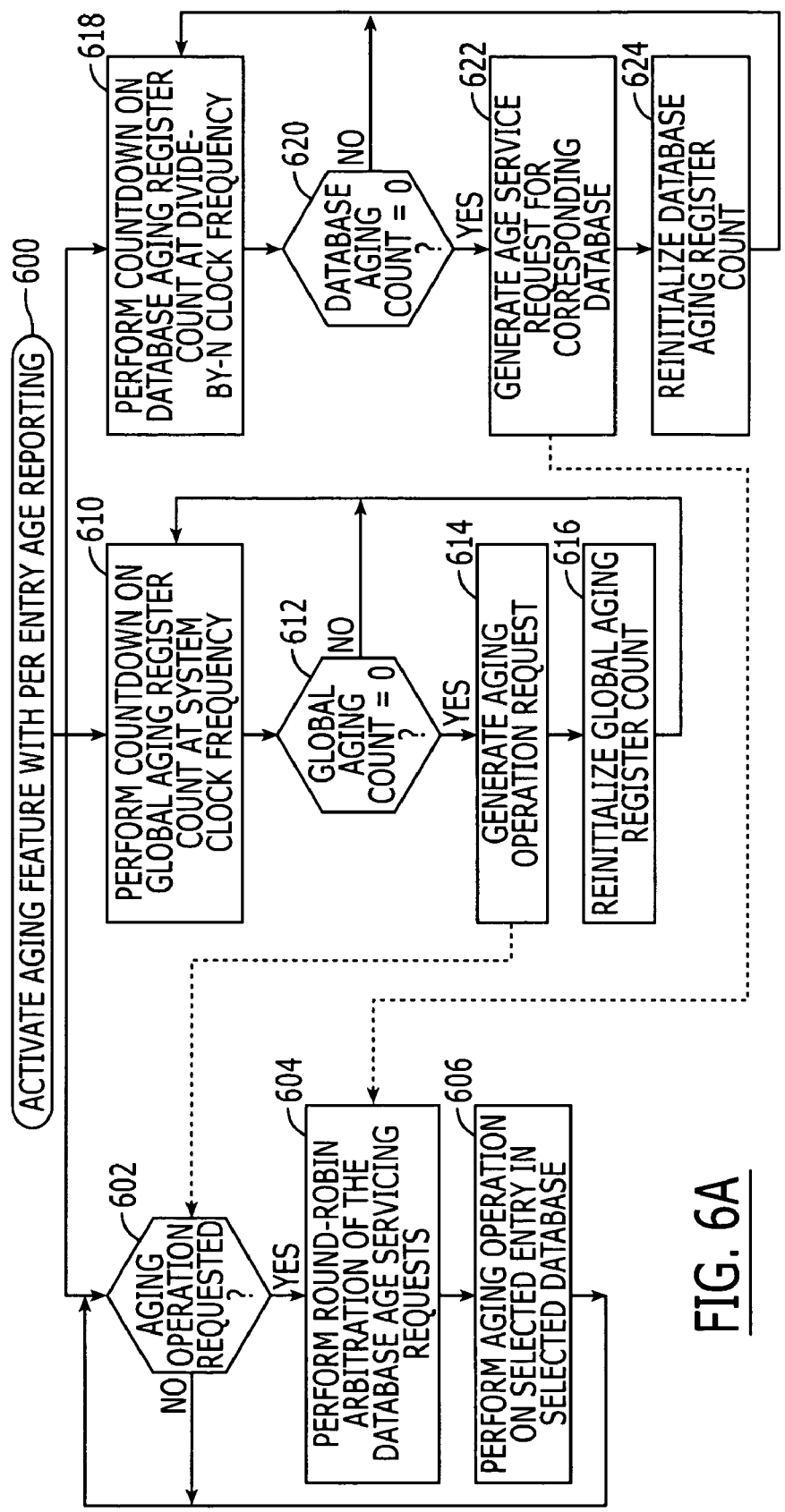

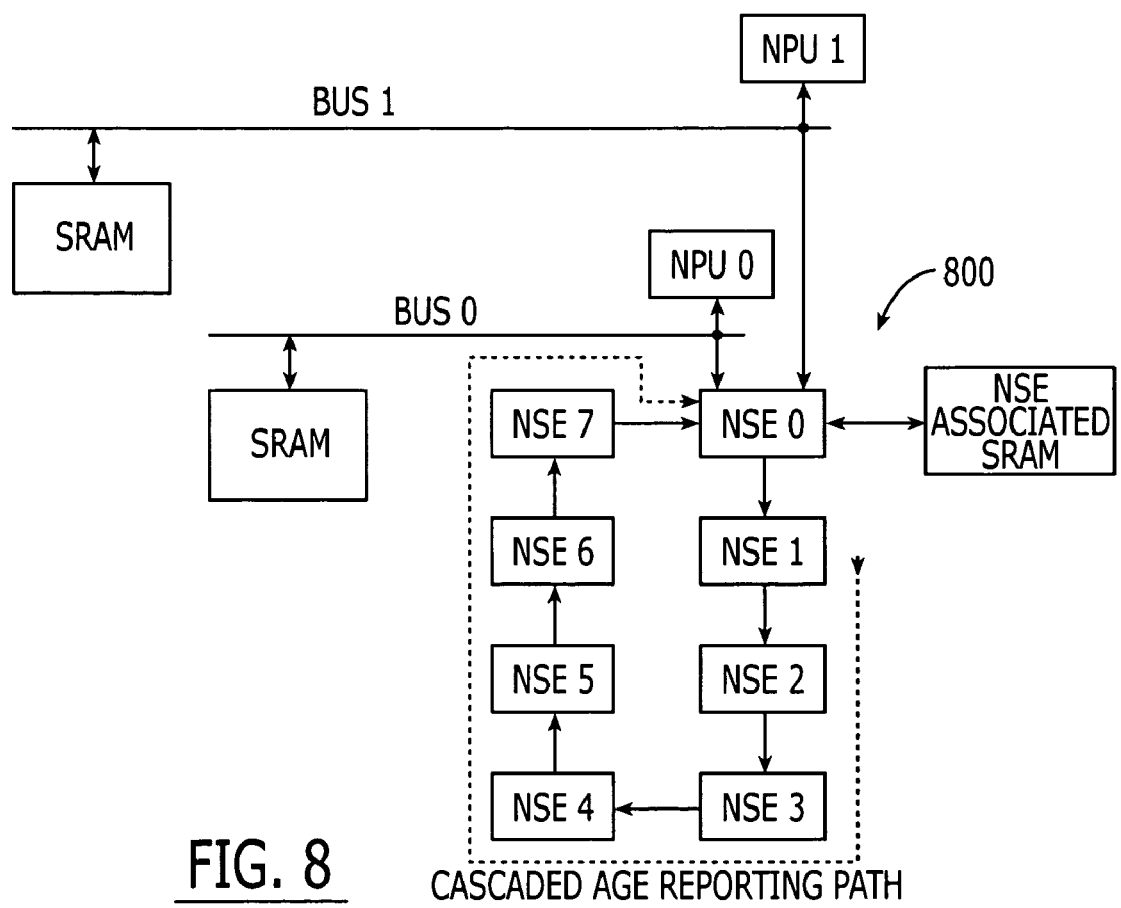
FIG. 8    CASCADED AGE REPORTING PATH

CAM-BASED SEARCH ENGINES HAVING PER ENTRY AGE REPORTING CAPABILITY

REFERENCE TO PRIORITY APPLICATION

This application is a continuation-in-part (CIP) of U.S. application Ser. No. 10/698,246, filed Oct. 31, 2003, which claims priority to U.S. Provisional Application Ser. No. 60/516,178, filed Oct. 31, 2003, the disclosures of which are hereby incorporated herein by reference.

FIELD OF THE INVENTION

The present invention relates to integrated circuit devices that support search operations and, more particularly, to CAM-based search engine devices and methods of operating same.

BACKGROUND OF THE INVENTION

Conventional network processor units (NPU) may be interfaced to integrated IP coprocessors (IIPC) in a manner that enables both SRAMs and IIPCs to be operated on the same memory mapped bus. As illustrated by FIG. 1, a conventional IIPC 30 may be coupled through a standard memory mapped interface to an NPU 10, which operates as a command source. The address bits ADDR[23:22] represent a two-bit select field that identifies one of four possible IIPCs on the bus for which a read operation is directed. The NPU 10 may include an SRAM controller that is based on FIFO communication. The SRAM controller includes internal bus control state machines 20 and pin control state machines 14. Data and address information is transferred between these state machines using push and pull data FIFOs 12a and 12d and read and write command FIFOs 12b and 12c that supply read and write addresses to the pin control state machines 14.

The IIPC 30 is illustrated as including a content addressable memory (CAM) core 36 and logic 38 that couples the CAM core 36 to the memory mapped interface. This memory mapped interface is illustrated as including read control logic 32 and write control logic 34. The write control logic 34 is configured to receive an address ADDR[21:0], a write enable signal WE_N[1:0], input data DATAIN[15:0] and input parameters PARIN[1:0]. The read control logic 32 is configured to receive the address ADDR[21:0] and a read enable signal RE_N[1:0] and generate output data DATAOUT[15:0] and output parameters PAROUT [1:0]. Like the SRAM controller within the NPU 10, this memory mapped interface is based on FIFO communication. The IIPC 30 performs operations using the input data DATAIN [15:0] and input parameters PARIN[1:0] and then passes back result values to the NPU 10. The timing between the receipt of the input parameters and the return of the corresponding result values is not fixed. Instead, it is determined by the amount of time the IIPC 30 requires to execute the specified instruction and depends on the number and type of other instructions currently pending within the IIPC 30.

These pending instructions are initially logged into respective instruction control registers 50 that support a plurality of separate contexts (shown as a maximum of 128). These instructions may be processed in a pipelined manner. The result values generated at the completion of each context are provided to respective result mailboxes 40. The validity of the result values within the mailboxes 40 is identified by the status of the done bit within each result mailbox 40. Accordingly, if a read operation is performed before the result values are ready, the NPU 10 will be able to check the validity of the done bit associated with each set of result values to determine whether the corresponding values of valid. However, because there can be multiple contexts in progress within the IIPC 30 at any given time and because the completion of the contexts does not necessarily occur in the same sequence as the requests were made, the NPU 10 may need to regularly poll the result mailboxes 40 at relatively high frequency to obtain new results as they become valid. Unfortunately, such regular polling can consume a substantial amount of the bandwidth of instructions that are issued to the IIPC 30 and lead to relatively high levels of operational inefficiency when the IIPC 30 is running a large number of contexts. Thus, notwithstanding the IIPC 30 of FIG. 1, which is capable of supporting a large number of contexts, there continues to be need for more efficient ways to communicate result status information from an IIPC to a command source, such as an NPU.

Referring now to FIG. 2A, another conventional IIPC 300 may include an aging feature that automatically removes stale entries from an internal CAM core 330. This aging feature can be operated as a fully independent hardware function requiring no software intervention or as a software-managed procedure with hardware assist. The IIPC 300 of FIG. 2A includes a memory mapped interface 302 having a write interface 304 and a read interface 306 therein. These write and read interfaces 304 and 306 may be configured as quad data rate interfaces that communicate to and from a command source (e.g., ASIC or NPU) having a compatible interface. A clock generator circuit 308 may also be provided that is responsive to an external clock EXTCLK. This clock generator circuit 308 may include delay and/or phase locked loop integrated circuits that operate to synchronize internal clocks within the IIPC 300 with the external clock EXT-CLK. A reset circuit 310, which is configured to support reset and/or power-up operations, is responsive to a reset signal RST. Context sensitive logic 312 may support the processing of multiple contexts. The context sensitive logic 312 may include an instruction memory 316 that receives instructions from the write interface 304 and a results mailbox 314 that may be accessed via the read interface 306. The instruction memory 316 may be configured as a FIFO memory device. The results mailbox 314 is a context specific location where the IIPC 300 places results returned from a previously issued command.

The internal CAM core 330 is illustrated as a ternary CAM core that contains a data array and a mask array 328. This CAM core 330 may be configurable into a plurality of independently searchable databases. General and database configuration registers 318 are also provided along with global mask registers GMRs 320. These registers provide data to instruction loading and execution logic 332, which may operate as a finite state machine (FSM). The instruction loading and execution logic 332 communicates with the CAM core 330 and the result logic 334. If the IIPC 300 is configured to support a depth-cascaded mode of operation, a cascade interface 338 may be provided for passing data and results to (and from) another IIPC (not shown). The instruction loading and execution logic 332 may also pass data to and from an external memory device, via an SRAM interface 336.

The aging logic 321 is illustrated as including two memory arrays: an age enable array 322 and an age activity array 324. These memory arrays may have bit positions that map directly to entries within the CAM core 330. Thus, if the CAM core 330 has 128 k entries (e.g., ×72 entries), then the age enable array 322 and age activity array 324 may each have a capacity of 128 k bits. The illustrated aging logic 321 may operate with the instruction loading and execution logic 332 to (i) reset age activity bits that have been previously set within the age activity array 324 in response to successful search operations and (ii) age out entries associated with previously reset activity bits by invalidating the corresponding entries.

The aging operations may include periodically inserting an aging instruction into an instruction pipeline within the IIPC 300. As illustrated by the global and database aging request circuit 350 of FIG. 2B, a global aging register 352 (e.g., 32-bit countdown counter) may be used to specify the number of cycles of a system clock SYSCLK that are to occur before each aging operation request is inserted into the instruction pipeline. Each aging operation that is inserted may operate to age one entry within a database that is programmed to support aging. Each database within the CAM core 330 may have an individually specified time period for aging, which means the frequency of the age service requests for the plurality of databases (shown as DB0–DB15) may be independently controlled. These time periods may be specified by a plurality of 24-bit countdown counters 356 that are set to database specific time constants (i.e., count values) and clocked at $\frac{1}{256}$th the system clock frequency. This slower clocking rate may be achieved with a divide-by-256 circuit 354 that is responsive to the system clock SYCCLK. As long as a database is enabled for aging, a database age service request is issued every time the corresponding 24-bit countdown counter 356 decrements to zero and is reinitialized. The IIPC 300 determines which database is to be serviced during each aging operation using a round-robin arbitration of all pending database age service requests. One entry within a selected database is aged in response to a selected age service request. The aging of a selected entry proceeds as follows. If a corresponding age enable bit for the entry is set to 0 within the age enable array 322, then the aging operation does nothing because the entry is not subject to aging. If the age enable bit is set to 1 within the age enable array 322 and a corresponding age activity bit is set to 1 (i.e., the entry is active) within the age activity array 324, then the aging operation clears (i.e., resets) the age activity bit to 0. Finally, if the age enable bit is set to 1 within the age enable array 322 and the corresponding age activity bit is set to 0 (i.e., the entry is inactive), then the aging operation removes the entry from the selected database by marking the entry as invalid (e.g., sets the valid bit associated with the entry in the CAM core 330 to an invalid state). The activity bit associated with an entry can be set to 1 whenever the entry is originally written into the CAM core 330 or a search operation results in a hit for the corresponding entry. A learn instruction and a set valid instruction may also operate to set an activity bit associated with a corresponding entry.

SUMMARY OF THE INVENTION

Integrated search engine devices according to embodiments of the present invention include a content addressable memory (CAM) core that is configured to support at least one database of searchable entries therein. The search engine device also includes a control circuit that is configured to support reporting to a command host (e.g., packet processing unit) of data that identifies aged entries from the CAM core. These aged entries include aged entries that have been aged out of the at least one database and/or entries that have at least exceeded an activity-based aging threshold. This reporting operation enables the command host to keep track of entries that should no longer be supported by the CAM core. The reporting operation is programmable on a per database basis and a per entry basis. This per entry reporting feature may be provided using a memory device that is configured to store a plurality of age report enable bits that map to respective entries in the at least one database.

Search engine devices according to still further embodiments of the present invention include a CAM and at least one FIFO memory device that is configured to store addresses of aged entries. A control circuit is also provided. This control circuit is configured to support reporting of addresses of the aged entries from the at least one FIFO memory device to an interface of the search engine device. The control circuit also includes a memory device that is configured to store a plurality of age report enable bits that map to respective entries in the CAM core. These age report enable bits identify which of the entries are to be reported to the at least one FIFO upon being identified as having exceeded an activity-based aging threshold.

A plurality of search engine devices may be configured as a multi-chip search machine. A search machine may include a "master" search engine device that is depth-cascaded to a plurality of "slave" search engine devices. The control circuit within the master search engine device is configured to support periodic reporting to a command host of addresses of first entries that have been aged out of the CAM core within the master search engine device and addresses of second entries that have been reported as aged out of one or more of the slave search engine devices.

A search engine device according to another embodiment of the present invention includes a CAM core and a control circuit that is configured to support periodic generation of at least one interrupt to a command host in response to detecting a sufficiently full storage device containing addresses of entries that have been aged out of the CAM core and/or addresses of entries that have exceeded an activity-based aging threshold. The storage device may comprise a FIFO memory device and the timing of the generation of the at least one interrupt may be controlled by registers. In particular, a level count register may be provided that is configured to maintain a count of unreported addresses in the FIFO memory device. A level configuration register may also be provided. This level configuration register maintains a threshold count value that specifies how many unreported addresses can be stored in the FIFO memory device before the control circuit issues the at least one interrupt. This interrupt will prompt the command host to issue an instruction that operates to empty the FIFO memory device.

BRIEF DESCRIPTION OF THE DRAWINGS

FIG. 6 includes FIG. 6A and FIG. 6B.

FIG. 8 is a block diagram that illustrates how the search engine device of FIG. 5 may be depth-cascaded in a system that supports per entry age reporting across multiple search engine devices.

DETAILED DESCRIPTION OF PREFERRED EMBODIMENTS

Figure 1:
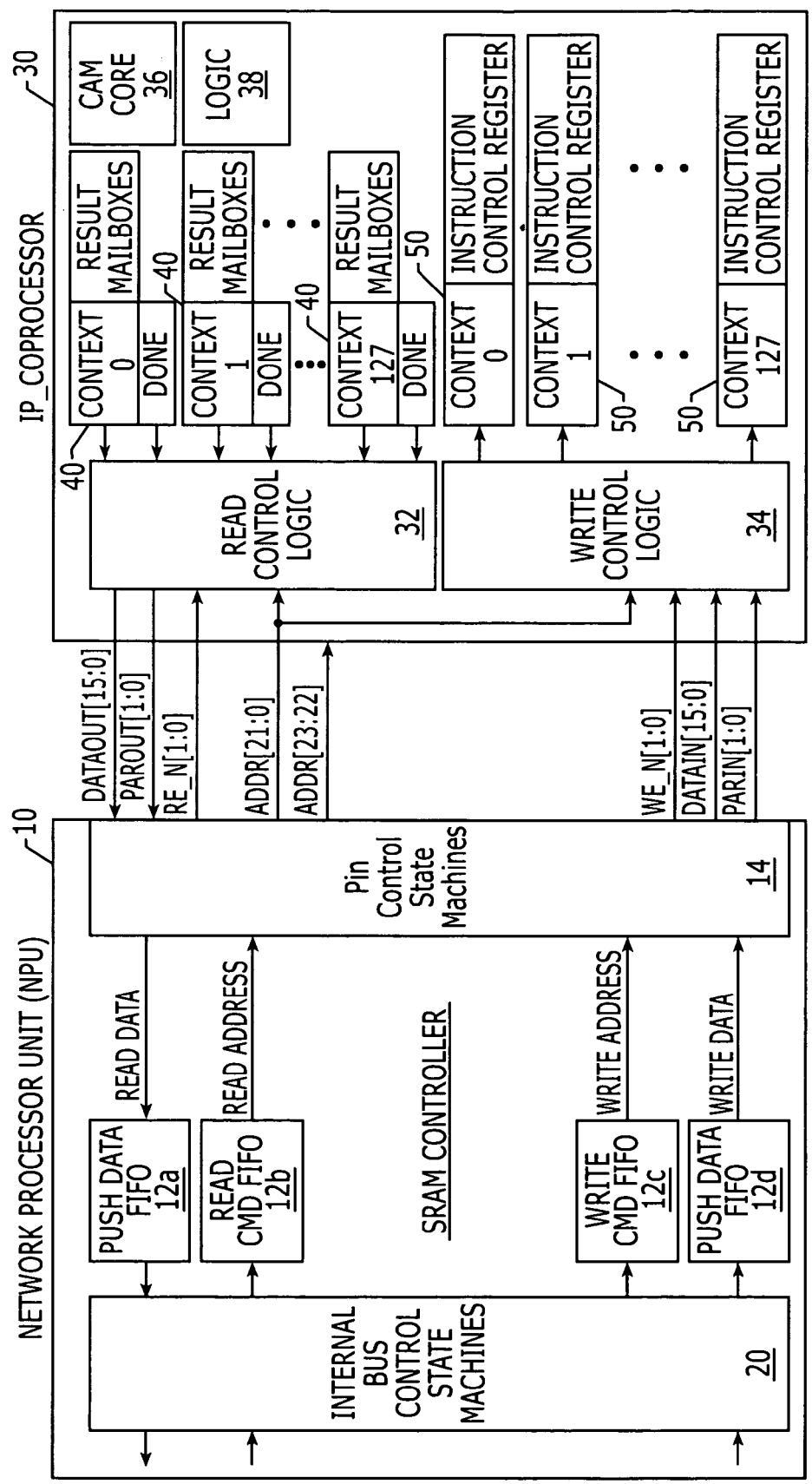
FIG. 1 is a block diagram of a network processor unit having an SRAM controller therein that is coupled to a conventional integrated IP-coprocessor (IIPC).

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. Moreover, when a device or element is stated as being responsive to a signal(s), it may be directly responsive to the signal(s) or indirectly responsive to the signal(s) (e.g., responsive to another signal(s) that is derived from the signal(s)).

Figure 3:
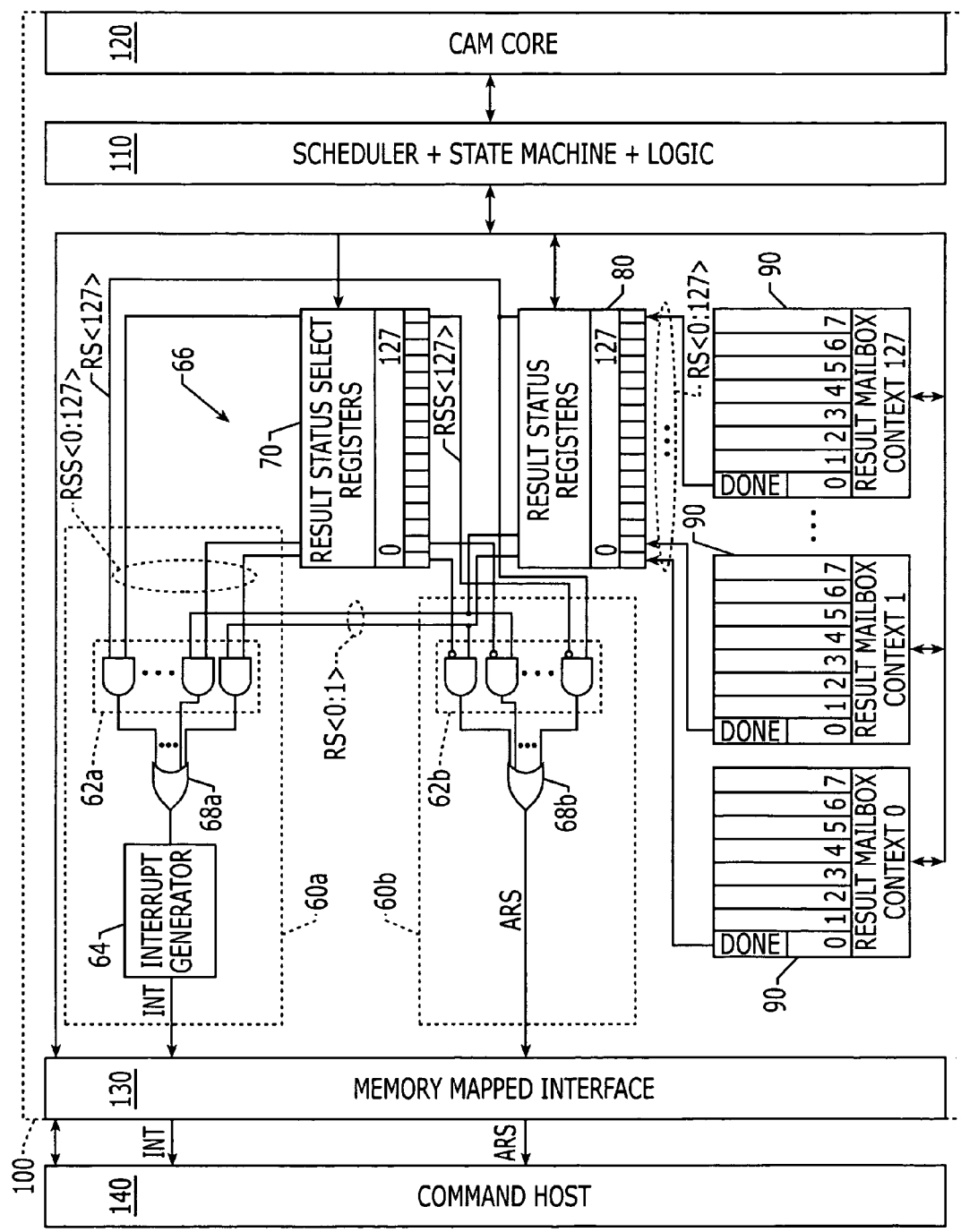
FIG. 3 is an electrical schematic that illustrates an integrated search engine device having result status signaling, according to embodiments of the present invention.

Referring now to FIG. 3, an integrated IP coprocessor (IIPC) 100 that is configured to operate as an integrated search engine device according to embodiments of the present invention will be described. This IIPC 100 includes a CAM core 120 having at least one database of searchable entries therein. In typical embodiments, the CAM core 120 may have as many as sixteen independently searchable databases. Programmable power management circuitry (not shown) may also be integrated with the CAM core 120 so that only a selected database(s) consumes power during a search operation. CAM cores having a fewer or larger number of databases are also possible. The CAM core 120 is electrically coupled to a control circuit. The control circuit is illustrated as including a scheduler, a finite state machine and logic 110 that can support multiple overlapping contexts. The control circuit is further illustrated as including: a plurality of result mailboxes 90, a result status register(s) 80, a result status select register 70, an interrupt indication circuit 60a and a non-interrupt indication circuit 60b. The result status register 80, result status select register, interrupt indication circuit 60a and non-interrupt indication circuit 60b collective define a result status notification circuit. The result mailboxes are illustrated as having a capacity to support result values from as many as 128 contexts. These mailboxes 90 also retain information that identifies whether the result values are valid or not. Result values are valid when the respective context is complete and the result values generated by the completed context have been loaded into a respective mailbox 90. When this occurs, the done status bit (DONE) associated with a respective mailbox 90 is set and remains set until such time as the respective mailbox 90 is read, at which point it is reset. The result status register(s) 80 is configured to retain a copy of the done status bits for the result mailboxes 90. In the illustrated embodiment, the result status register 80 is illustrated as a 128-bit register. This register may be partitioned at 32-bit segments (i.e., four registers), which support efficient reading of the contents of the result status register 80 across a 32-bit wide bus at a single data rate (SDR) or a 16-bit wide bus at a dual data rate (DDR). The result status register 80 receives and generates a 128-bit result status signal RS<0:127>, which indicates the states of completion of a corresponding plurality of contexts being handled by the search engine device. For example, if the result status signal RS<0:127> is set to the value of <0101000 . . . 000110>, then contexts 1, 3, 125 and 126 are done and the result values for those contexts are valid and the remaining contexts are not done.

The result status select register(s) 70 is a 128-bit programmable register that generates a result status select signal RSS<0:127>. This signal operates to select one of two indication circuits for receipt of active bits within the result status signal RS<0:127>. These indication circuits are illustrated as an interrupt indication circuit 60a and a non-interrupt indication circuit 60b. The interrupt indication circuit 60a includes an interrupt generator 64 that generates an interrupt INT to the command host 140 via the memory mapped interface 130. The interrupt generator 64 may also generate interrupts in response to other activity within the control circuit, according to a predefined protocol. In contrast, the non-interrupt indication circuit 60b generates an asynchronous aggregate result status signal (ARS) to the command host 140 via the memory mapped interface 130. This ARS signal is configured to have a leading edge that occurs when a first one of a selected plurality of contexts is completed and an active level that is held so long as at least one of the selected plurality of contexts remains completed (i.e., done status bit remains set).

The interrupt indication circuit 60a has a first bank 62a of AND gates that output to an OR gate 68a. The non-interrupt indication circuit 60b has a second bank 62b of AND gates that output to an OR gate 68b. When one or more bits of the result status select signal RSS<0:127> are set high to logic 1 levels, then the corresponding result status signals RS<0:127> are passed to the inputs of the OR gate 68a. If any of these result status signals are switched to active logic 1 values, then the output of the OR gate 68a will switch and cause the interrupt generator 64 to produce an interrupt INT at the memory mapped interface 130. But, when one or more bits of the result status select signal RSS<0:127> are set low to logic 0 levels, then the corresponding result status signals RS<0:127> are passed to the input of the OR gate 68b. Accordingly, if the result status select signal RSS<0:127> is set so that RSS<0:127>=<00000 . . . . 0000>, then the aggregate result status signal at the output of the OR gate 68b will be switched high (or held high) whenever any of the result status bits RS<0:127> is set high to indicate the completed state of a respective context. Alternatively, if the result status select signal RSS<0:127> is set so that RSS<0:127>=<11111 . . . . 1111>, then the signal at the output of the OR gate 68a will be switched high (or held high) whenever any of the result status bits RS<0:127> is set high to indicate the completed state of a respective context. In this manner, the result status select register 70 provides programmable control over how the result status signals are to be reported to the command host 140.

Based on the above-described configuration of the control circuit, the completion of any context within the IIPC 100 will result in the transfer of result values from the scheduler, state machine and logic 110 to a corresponding result mailbox 90. Assuming this context represents a first-to-finish operation (e.g., lookup within the CAM core), then the setting of the respective done bit within the result mailbox 90 will result in the latching of this done information by the result status register(s) 80. If this done information relates to context 0, then the result status signal RS<0:127> will equal <10000 . . . 000>. If the result status select register is set so that the result status select signal RSS<0:127> equals <0XXXXXX . . . X>, where X represents a "don't care" for purposes of this example, then the aggregate result status signal ARS will be set to an active high level and passed from the memory mapped interface 130 to the command host 140. Alternatively, if the result status select register is set so that the result status select signal RSS<0:127> equals <1XXXXXX . . . X>, then the output of the OR gate 68a within the interrupt indication circuit 60a will switch high. This active high signal at an input of the interrupt generator 64 will result in the generation of an interrupt that passes to the memory mapped interface 130 and the command host 140.

In response to the generation of an interrupt INT or an active high aggregate result status signal ARS, the command host 140 may issue an operation to read the result status register 80. This operation includes generating an address ADDR[23:0] to the memory mapped interface 130. The fields of this address are illustrated by TABLE 1. The two most significant bits of the address operate to select the particular IIPC 100 for which the read operation is destined. The seven address bits ADDR<21:15> identify a particular context within a range of 128 possible contexts. The eleven address bits ADDR<4:14> are not used. The address bit ADDR<3> represents a result status identifier (RES_STATUS). If this bit is set to a first logic value (e.g., 0), then an entry within the result mailbox 90 associated with the designated context is to be read back to the command host 140. On the other hand, if the result status identifier is set to a second logic value (e.g., 1), then a designated portion of the result status register 80, which identifies the value of 32 result status signals, is to be read back to the command host. The final 3-bit portion of the address, shown as ADDR<2:0>, identifies an entry value. As illustrated by TABLE 2, this entry value identifies one of eight entries to be read from the designated result mailbox 90 when the result status identifier RES_STATUS is set to a logic 0 value. Alternatively, the entry value identifies one of four portions of the result status register 80 to read from when the result status identifier is set to a logic 1 value. In this manner, four consecutive read operations may be performed to enable the command host to read the entire contents of the result status register 80 and thereby readily identify which ones of the 128 result mailboxes 90 contain valid result values.

| 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|----|----|----|----|----|----|----|----|----|----|----|----|----|----|---|---|---|---|---|---|---|---|---|---|
| SELECT | | | CONTEXT | | | | | | | NOT USED | | | | | | | | | | RES STATUS | ENTRY VALUE | | |

TABLE 1

TABLE 2

| RES_STATUS | ENTRY VALUE | ACTION |
|---|---|---|
| 0 | 000 | READ ENTRY 0 IN CONTEXT SPECIFIC MAILBOX |
| 0 | 001 | READ ENTRY 1 IN CONTEXT SPECIFIC MAILBOX |
| 0 | 010 | READ ENTRY 2 IN CONTEXT SPECIFIC MAILBOX |
| 0 | 011 | READ ENTRY 3 IN CONTEXT SPECIFIC MAILBOX |
| 0 | 100 | READ ENTRY 4 IN CONTEXT SPECIFIC MAILBOX |
| 0 | 101 | READ ENTRY 5 IN CONTEXT SPECIFIC MAILBOX |
| 0 | 110 | READ ENTRY 6 IN CONTEXT SPECIFIC MAILBOX |
| 0 | 111 | READ ENTRY 7 IN CONTEXT SPECIFIC MAILBOX |
| 1 | 000 | READ RESULT STATUS BITS [31:0] |
| 1 | 001 | READ RESULT STATUS BITS [63:32] |
| 1 | 010 | READ RESULT STATUS BITS [95:64] |
| 1 | 011 | READ RESULT STATUS BITS [127:96] |
| 1 | 100 | RESERVED |
| 1 | 101 | RESERVED |
| 1 | 110 | RESERVED |
| 1 | 111 | RESERVED |

Figure 4:
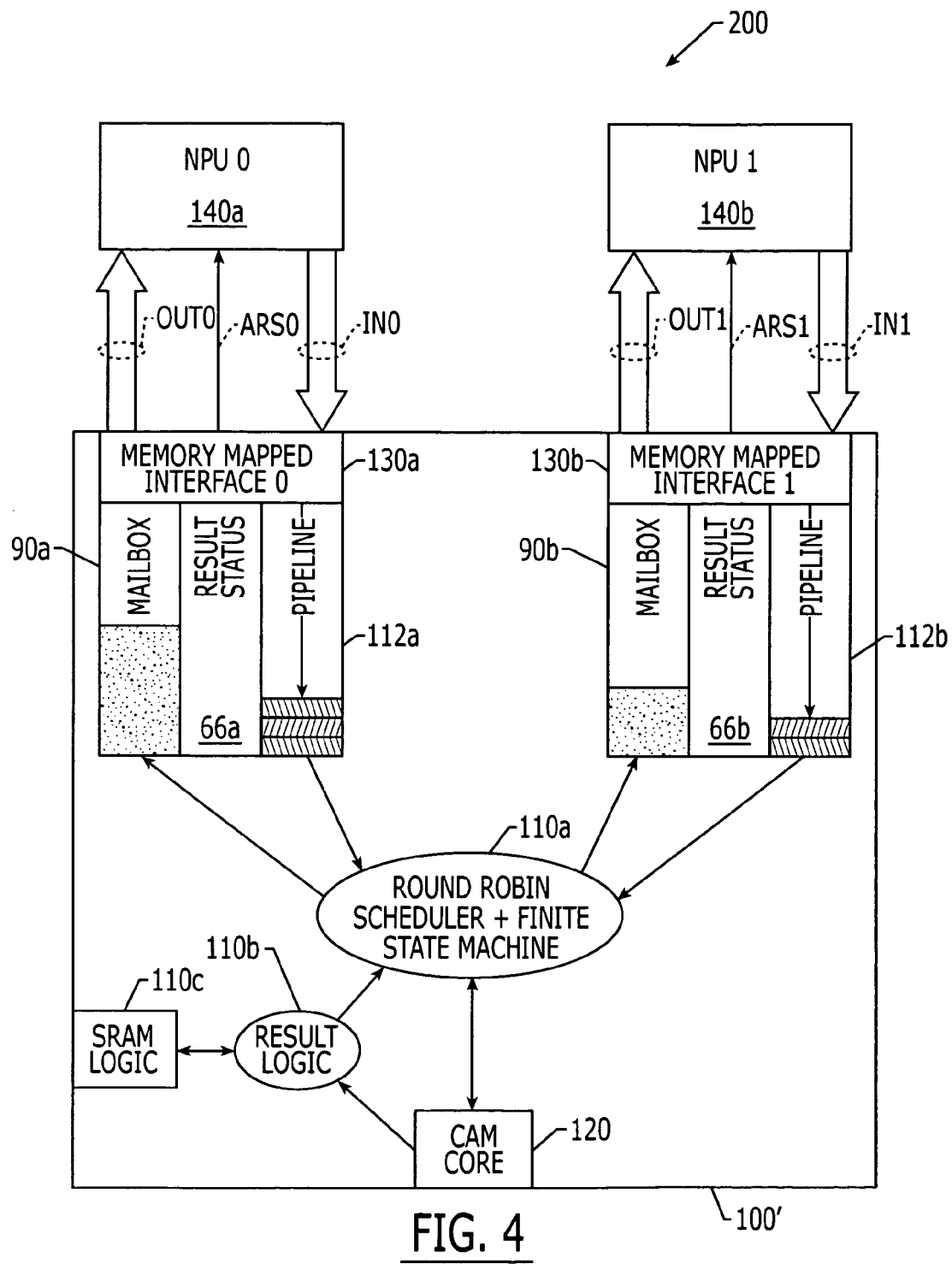
FIG. 4 is a block diagram of an integrated circuit system that includes a pair of network processor units (NPUs) and an integrated search engine device having two quad data rate interfaces, according to embodiments of the present invention.

Referring now to FIG. 4, an integrated circuit system 200 according to another embodiment of the present invention will be described. This system 200 is illustrated as including an IIPC 100' that is configured in accordance with the IIPC 100 of FIG. 3. In addition, the IIPC 100' includes a pair of memory mapped interfaces 130a and 130b that communicate with a pair of network processor units (NPUs) 140a and 140b. Each memory mapped interface 130a and 130b is associated with respective mailboxes (90a and 90b), result status notification circuits (66a and 66b) and pipelined instruction circuits 112a and 112b. These pipelined instruction circuits 112a and 112b share access to a round robin scheduler and finite state machine 110a. Logic circuits, in the form of SRAM logic 110c and result logic 110b, communicate with the CAM core 120 and the state machine 110a.

Figure 5:
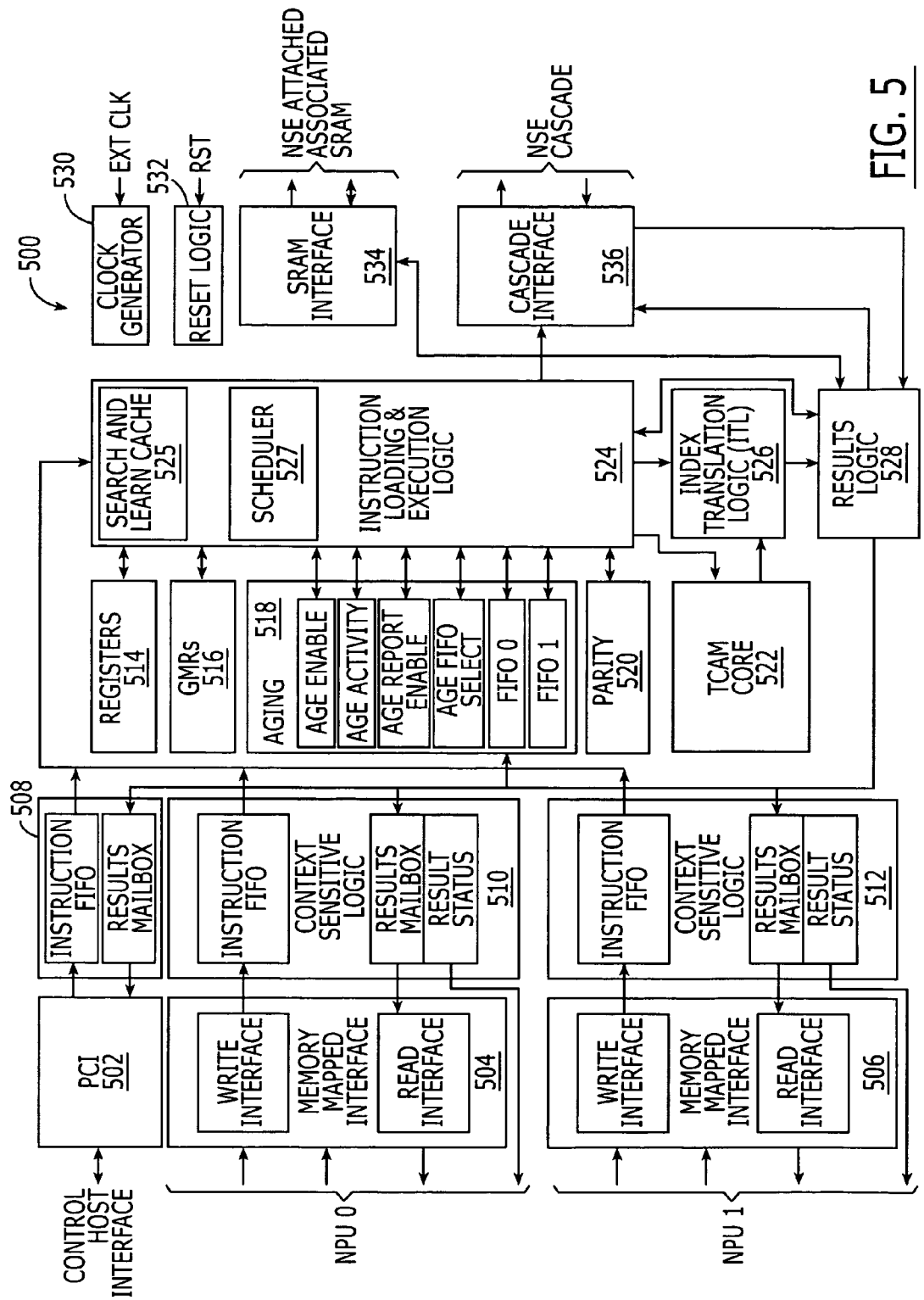
FIG. 5 is a block diagram of a CAM-based search engine device with per entry age reporting capability, according to embodiments of the present invention.

Referring now to FIG. 5, a CAM-based search engine device 500 according to another embodiment of the present invention has the capability of performing age reporting on a per entry basis to a command host(s). The search engine device 500 is illustrated as including a ternary CAM core 522 and a number of surrounding logic circuits, registers and memory devices that collectively operate as a control circuit that is coupled to the CAM core 522. This control circuit is configured to perform the functions and operations described herein. The search engine device 500 may include a peripheral controller interconnect (PCI) interface 502, which is configured to enable a control plane processor to have direct access to the search engine device 500. Instructions received at the PCI interface 502 are passed to an interface logic circuit 508 having an instruction memory (e.g., FIFO) and results mailbox therein. The search engine device 500 also includes a dual memory mapped interface, which is typically a dual quad data rate interface. The first memory mapped interface 504 contains a write interface and a read interface that can support communication with a network processor unit (e.g., NPU 0). The second memory mapped interface 506 also contains a write interface and a read interface that can support communication with a network processor unit (e.g., NPU 1).

A clock generator circuit 530 and reset logic circuit 532 are also provided. The clock generator circuit 530 may include a delay and/or phase locked loop circuit that is configured to generate internal clock signals that are synchronized with an external clock signal EXTCLK. The reset logic circuit 532 may be configured to perform reset operations when the device 500 is initially powered up or after a chip reset event has occurred. An SRAM interface 534 may also be provided to enable transfer of data to and from an external memory device (e.g., associated SRAM). A cascade interface 536 is provided to support depth-cascading between the search engine device 500, operating as a "master" device, and a plurality of additional "slave" search engine devices that may be coupled together as illustrated and described more fully hereinbelow with respect to FIG. 8. Other cascading arrangements are also possible.

First and second context sensitive logic circuits 510 and 512 are coupled to the first and second memory mapped interfaces 504 and 506, respectively. These context sensitive logic circuits 510 and 512 are illustrated as including instruction FIFOs and results mailboxes. The context sensitive logic circuits 510 and 512 may also includes results status circuits that are configured to generate respective aggregate result status signals (ARS) and interrupts, as described more fully hereinabove with respect to FIGS. 3–4. The interrupts may also be used to signify when the age reporting functions may be commenced.

An instruction loading and execution logic circuit 524 is provided with an instruction scheduler 527 and a search and learn (SNL) cache 525. This logic circuit 524 may perform the functions of a finite state machine (FSM) that controls access to the CAM core 522 and utilizes resources provided by specialized function registers 514, global mask registers 516, parity generation and checking circuitry 520 and an aging control logic circuit 518. The SNL cache 525 may support the performance of search and learn operations within the CAM core 522. During search operations, the instruction loading and execution logic circuit 524 provides the CAM core 522 with search words that may be derived from search keys received at a memory mapped interface. In response to a search operation, the CAM core 522 may generate a plurality of hit signals that are encoded to identify an address of a highest priority matching entry within the CAM core 522. This address may also be encoded as an absolute index that specifies the location of the highest priority matching entry with a multi-chip search machine. In some embodiments, the address may be provided to an index translation logic circuit 526 (ITL). This index translation logic circuit 526 may modify the addresses relative to a selected database to thereby create database relative indexes. Alternatively, the addresses may be modified relative to an NPU-attached associated SRAM to thereby create memory pointer indexes. A results logic circuit 528 is also provided. The results logic circuit 528 is configured to pass results values from the index translation logic circuit 526, the instruction loading and execution logic circuit 524 and the cascade interface 536 to results mailboxes associated with the context sensitive logic circuits 510 and 512 and the interface logic circuit 508.

Figure 7A:
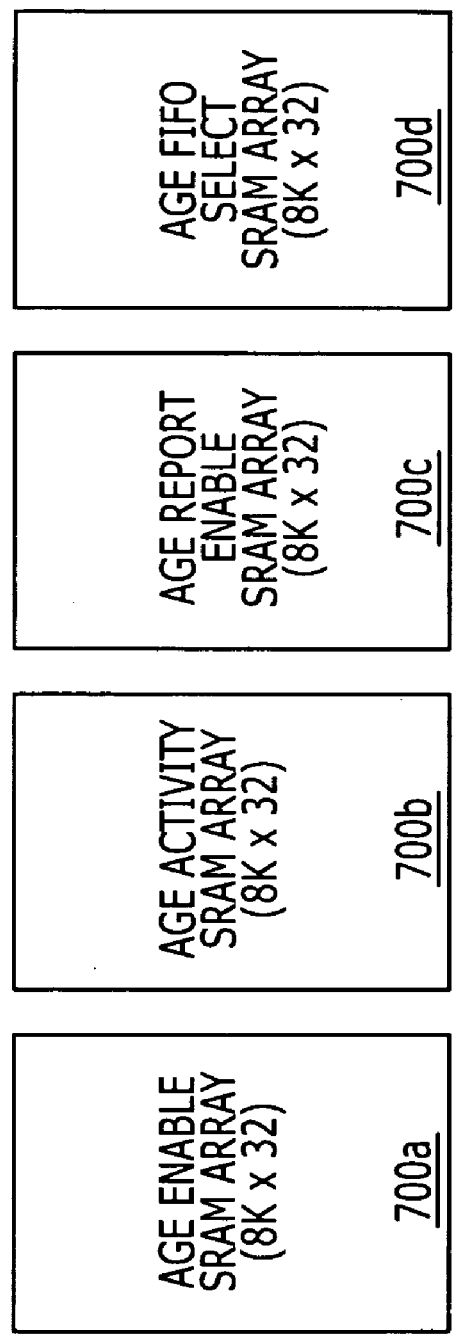
FIG. 7A illustrates a plurality of memory devices that may be used in a aging control circuit illustrated in FIG. 5.
Figure 7B:
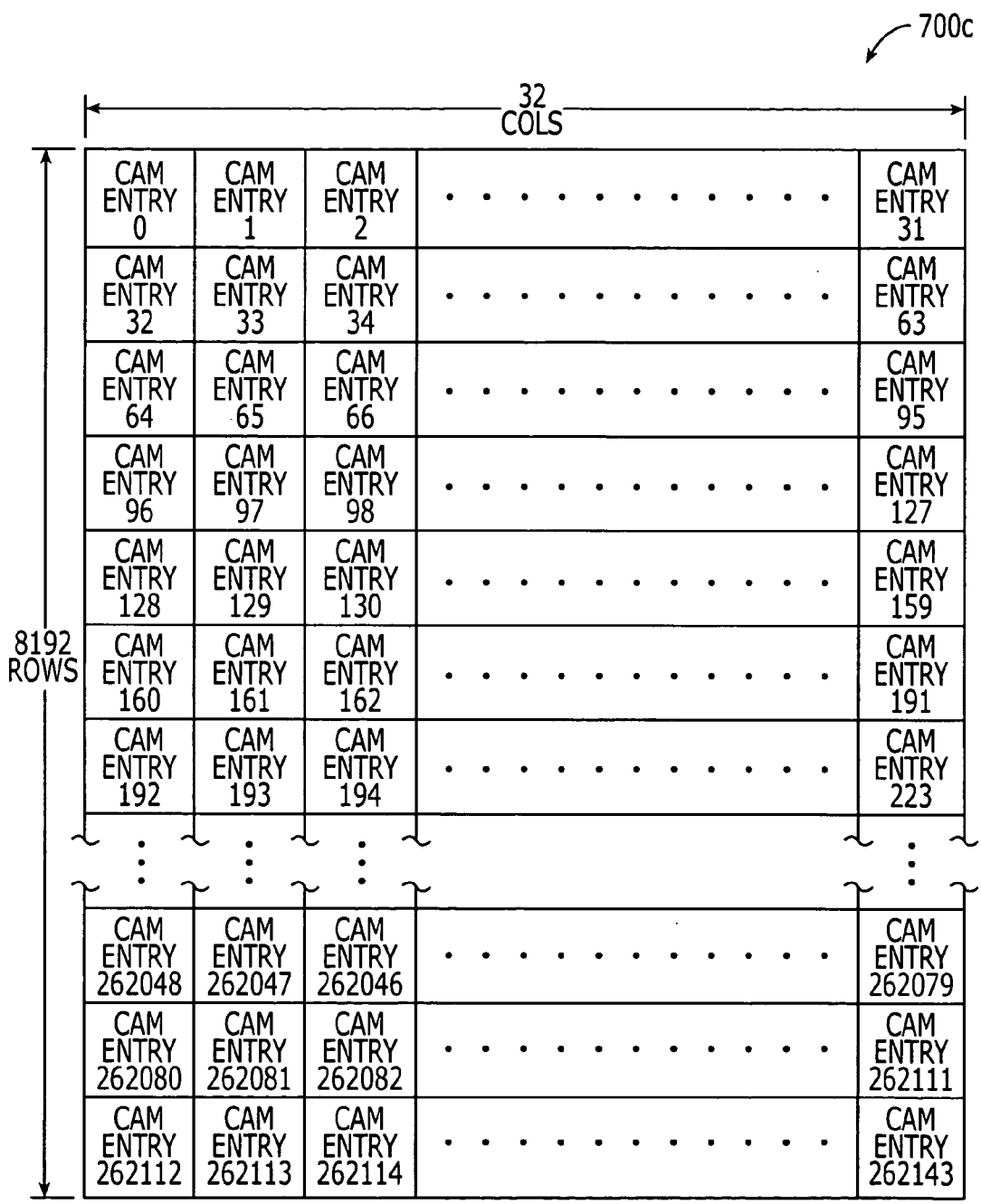
FIG. 7B illustrates the mapping of bit positions within an age report enable memory array to a CAM core illustrated in FIG. 5.

The aging control logic circuit 518 is illustrated as including a plurality of memory devices, which may be updated as each entry is written into the CAM core 522 and during periodic aging operations. These memory devices include a quad arrangement of SRAM memory arrays 700a–700d, as illustrated more fully by FIG. 7A. These memory arrays include an age enable memory array 700a, an age activity memory array 700b, an age report enable memory array 700c and an age FIFO select memory array 700d. In the illustrated embodiment, each bit position within each memory array maps to a corresponding entry within the CAM core 522. Thus, memory arrays having a capacity of 8 k rows and 32 columns will support a CAM core 522 having 256 k entries therein. FIG. 7B illustrates in detail how each bit within the age report enable array 700c maps to a respective entry within the CAM core 255 having 256 k entries (i.e., 262,144 entries).

Figure 2A:
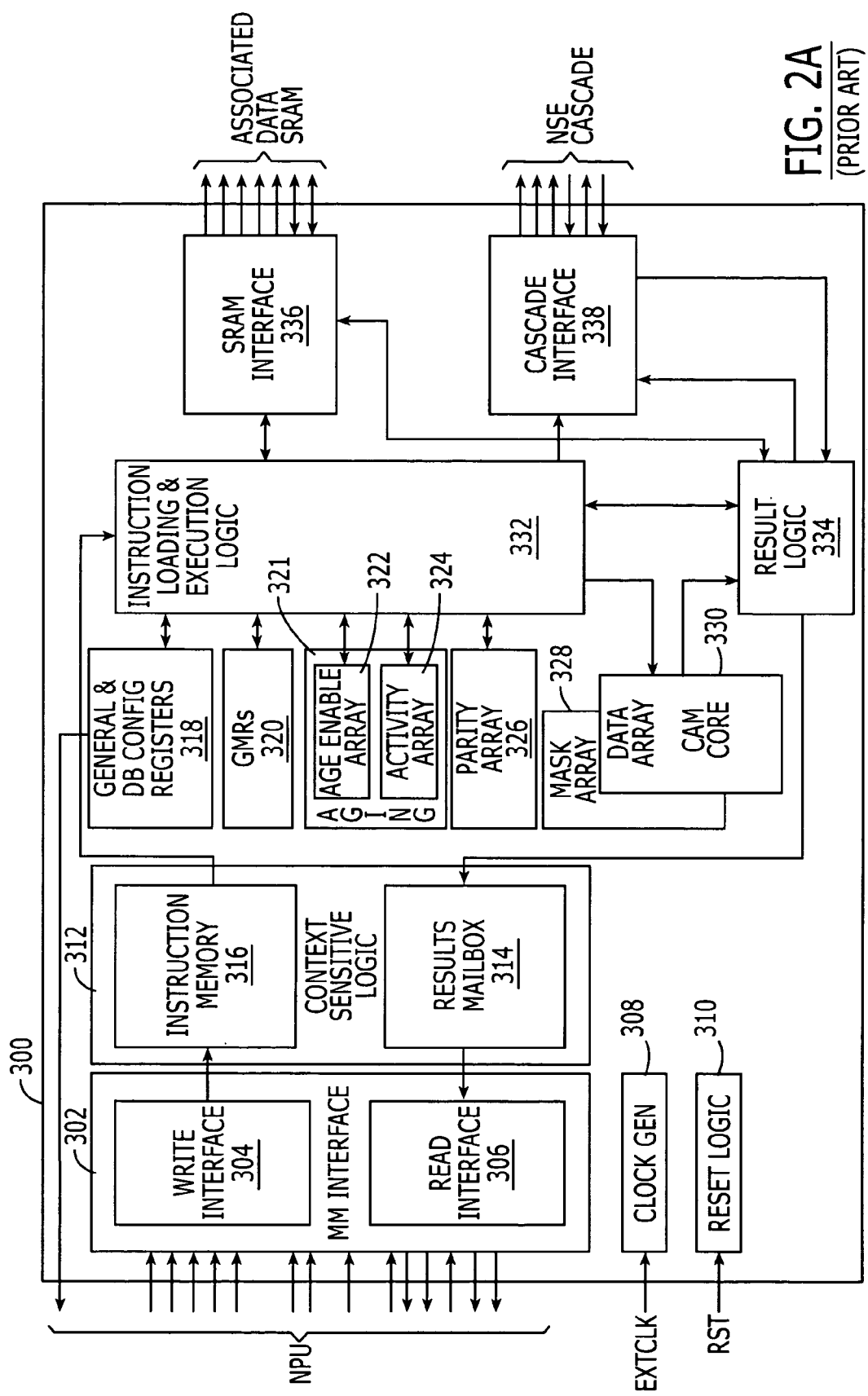
FIG. 2A is a block diagram of a conventional IIPC that supports automatic aging of CAM core entries.

The data within the age enable memory array 700a identifies which CAM core entries are subject to aging. For example, each bit position within the age enable memory array 700a that is set to a logic 1 value (or logic 0 value) may reflect a corresponding CAM core entry that is subject to (or not subject to) aging. Each bit position within the age activity memory array 700b may reflect whether a corresponding CAM core entry has remained active since the time it was first written into the CAM core 522. For example, a logic value of 1 may reflect an active CAM core entry that has been the subject of a "hit" during a search operation (or one that has been relatively recently written to the CAM core) and a logic value of 0 may reflect an inactive CAM core entry that is ready to be aged out of the CAM core 522. Some of the automated aging operations associated with the age enable and age activity memory arrays 700a–700b are described more fully hereinabove with reference to FIG. 2B and the age enable and age activity memory arrays 322 and 324 in FIG. 2A.

The age report enable memory array 700c reflects which entries are to be reported to a command host in response to being aged out of the CAM core 522. In the event a report only aging feature is provided on a global (i.e., full CAM core), per database and/or per entry basis, the age report enable memory array 700c may also identify those entries that have exceeded an activity-based aging threshold but have not undergone a final aging out operation (i.e., their valid bits have not been reset to an invalid condition). Thus, a bit position having a logic value of 1 within the age report enable memory array 700c may identify a corresponding CAM core entry as being subject to age reporting. In contrast, a bit position having a logic value of 0 within the age report enable memory array 700c may identify a corresponding CAM core entry as not being subject to age reporting when the entry is aged out of the CAM core 522.

The age FIFO select memory array 700*d* reflects where an entry, which is already the subject of age reporting, is reported to upon being aged out of the CAM core 522. By using one bit per CAM entry, one of two possible age reporting locations is possible. These two age reporting locations include a first FIFO (FIFO 0) and a second FIFO (FIFO 1), which are located within the aging control logic circuit 518. These FIFOs may each have a capacity of 255 entries. By using a larger memory array, which supports two or more bits per CAM entry, a greater number of age reporting locations may be identified by the age FIFO select memory array 700*d*. These first and second FIFOs may be accessed from any of the illustrated interfaces.

The instruction loading and execution logic circuit 524 also operates to control the periodic reporting of the addresses/indexes of the entries from the reporting locations (i.e., FIFO 0 and FIFO 1) to a command host. The phrase "periodic reporting" includes regularly spaced or intermittent reporting that is initiated by the command host or possibly initiated by the IIPC. These reporting operations are performed with the assistance of a plurality of the specialized function registers 514. These registers 514 include a first level count register and a second level count register. The first level count register is configured to maintain a count of unreported addresses that are stored in aging FIFO 0 and the second level count register is configured to maintain a count of unreported addresses that are stored in aging FIFO 1. The registers 514 also includes a first level configuration register and a second level configuration register. The first level configuration register is configured to maintain a programmable threshold count value that specifies how many addresses can be stored in aging FIFO 0 before the control circuit issues an interrupt to the command host (e.g., NPU 0) to thereby prompt the command host to issue a read request for the addresses stored within aging FIFO 0. Similarly, the second level configuration register is configured to maintain a programmable threshold count value that specifies how many addresses can be stored in aging FIFO 1 before the control circuit issues an interrupt to the command host (e.g., NPU 1) to thereby prompt the command host to issue a read request for the addresses stored within aging FIFO 1. The registers 514 may also include a first interrupt timer register that operates as a timer to support generation of an interrupt to the command host when no new addresses have been reported to aging FIFO 0 during a programmed time interval and at least one unreported address is stored within aging FIFO 0. This first interrupt timer is used so that the command host (e.g., NPU 0) is aware of the presence of at least one address within aging FIFO 0, even though the threshold count value stored in the first level configuration register has not been exceeded. A second interrupt timer register is also provided to operate in a similar manner with respect to aging FIFO 1.

Figure 2B:
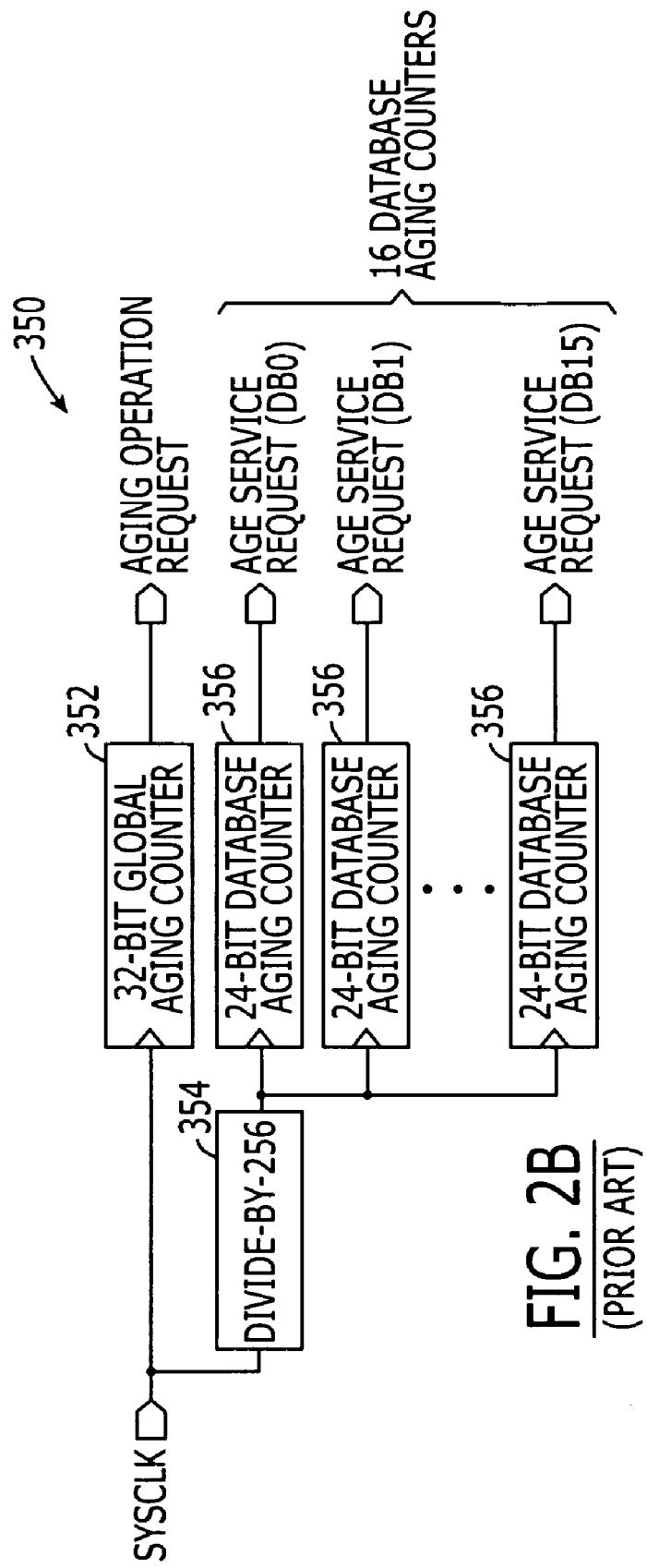
FIG. 2B is a block diagram of multi-bit counters that are configured to generate aging operation requests and age services requests within the IIPC of FIG. 2A.

Aging operations performed by the control circuit of FIG. 5, which includes the instruction loading and execution logic circuit 524 and the aging control logic circuit 518, include the operations illustrated by FIG. 6. In FIG. 6A, the aging feature of the search engine device 500 may be activated to support age reporting on a per entry basis, Block 600. Once activated, multiple operations are performed in parallel to generate global aging operation requests and age service requests on a per database basis. At Block 602, a check is made to determine whether a global aging operation has been requested. If so, a round-robin arbitration operation is performed on any pending database age servicing requests 604. As illustrated by FIG. 2B, global aging operation requests and database age servicing requests may be generated by programmable aging registers that are configured as countdown counters. The aging counters for those databases that have been programmed to not support aging may be disabled. At Block 606, an aging operation that supports reporting is performed on an entry within a selected database and then control is returned back to Block 602 to await the next global aging operation request.

Blocks 610–616 illustrate a sequence of operations that may be performed to generate each aging operation request on a global basis within the search engine device. At Block 610, a countdown operation is commenced in a global aging register and a check is continuously made at Block 612 to determine whether a countdown operation has completed. If so, an aging operation is requested (see, Block 602) and the global aging register count is reloaded into the global aging register, Block 616.

Blocks 618–624 illustrate operations that may be used to generate age service requests for respective databases. If a CAM core is configured to support a maximum of 16 databases, then sixteen sets of operations corresponding to Blocks 618–624 are performed in parallel at potentially different frequencies. As illustrated by Block 618, a countdown operation is performed on a database aging register at a specified frequency. When the count reaches zero, an age service request is issued for the corresponding database Blocks 620–622. At Block 624, the corresponding database aging register count is reinitialized and the operations are repeated. The database aging register count values should be sufficiently high to prevent a backlog of age service requests for a given database when the round-robin arbitration of the database age servicing requests is performed, Block 606.

Figure 6B:
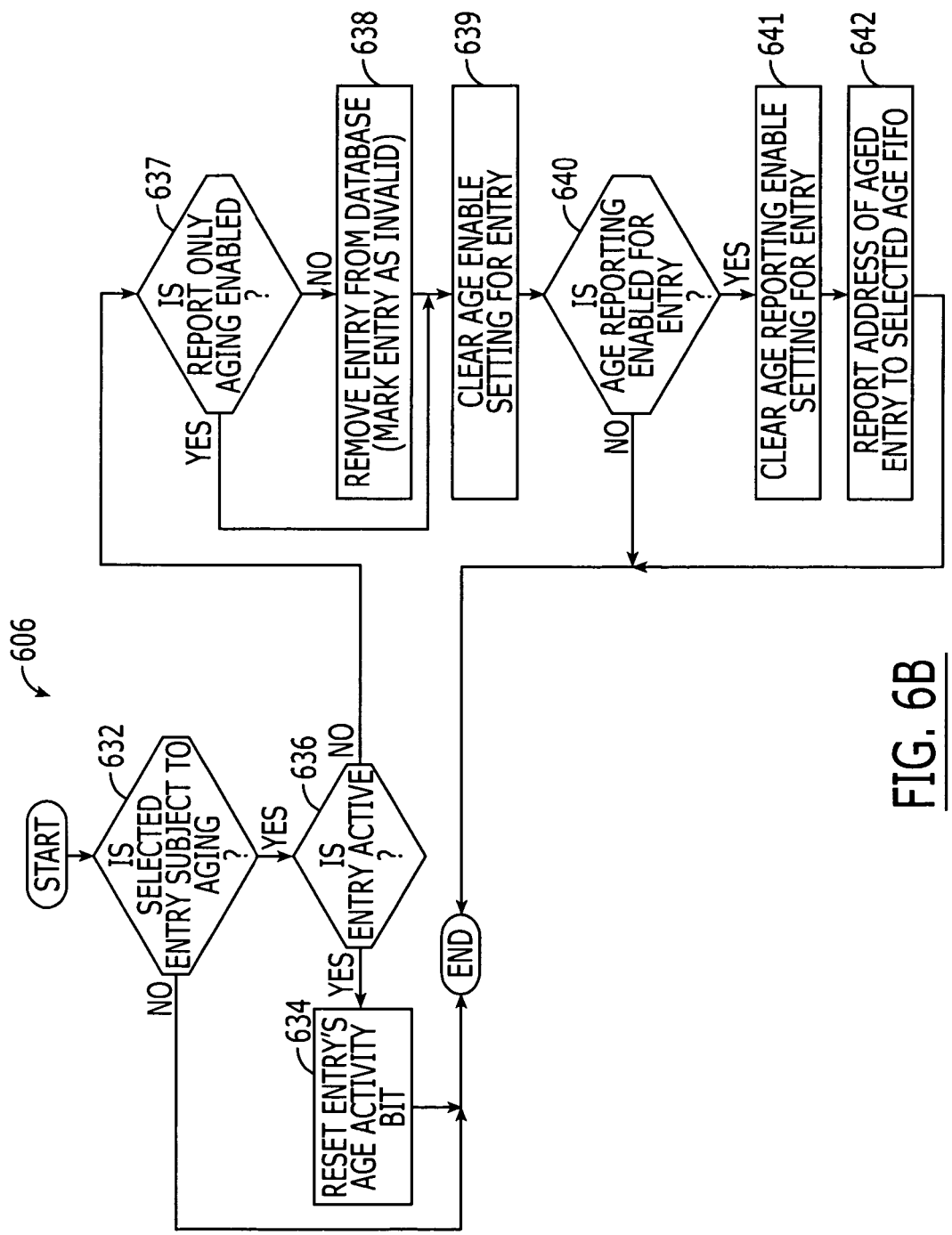
FIG. 6 is a flow diagram of operations that illustrates methods of reporting entries that have been aged out of a search engine device, according to embodiments of the present invention.

As illustrated by FIG. 6B, operations 606 for performing aging on a selected entry within a selected database include a checking operation to determine whether a selected entry is subject to aging, Block 632. This operation includes checking the corresponding bit position within the age enable memory array 700*a* to determine whether the entry is subject to aging. If the selected entry is subject to aging, then a check is made to see if the entry is active or not, Block 636. If the age activity memory array 700*b* indicates that the entry is active (e.g., the age activity bit is set to 1), then the corresponding age activity bit is reset and the aging operation is complete, Block 634. However, if the entry is not active (e.g., the age activity bit is set to 0), then a check is made at Block 637 to determine whether report-only aging is enabled. If report-only aging is enabled, then Block 638 is bypassed. The report-only aging feature may be established on a global basis (e.g., by setting an AR ONLY GLOBAL bit within an aging control circuit 518) or per database basis (by setting an AR ONLY bit within a corresponding database configuration register (see, e.g., registers 514). When the report-only aging feature is applied to an entry that is scheduled to be aged out (i.e., Block 636 decision results in a "NO" conclusion, which means the entry has exceeded an activity-based aging threshold), an address of the entry may be reported to an aging FIFO, but the entry will not be aged out by having its validity bit reset.

If report-only aging is not enabled, then the selected entry is removed from its database (e.g., the entry is marked as invalid using a CLEAR VALID instruction that causes an access to the CAM core 522), Block 638. An entry may be marked as invalid by resetting the validity bit for the entry. Alternatively, a predetermined data string having a validity bit that is set to an invalid state may be written over the aged out entry. This may be particularly helpful in those embodiments that support background error detection and/or correction with parity and/or Hamming code bits. In some cases, the value of the validity bit may influence the value of the parity and/or Hamming code bits and merely resetting the validity bit when performing an age out operation may cause the entry to be improperly detected as invalid (and then possibly corrected by setting the validity bit to a valid state) during a background error detection and/or correction operation. To prevent the unintentional correction of an aged out entry, the predetermined data string having correct parity and/or Hamming code bits may be used as a default word that is to be written over every entry that is to be aged out of the CAM core.

As illustrated by Block 639, the corresponding age enable bit within the age enable memory array 700*a* is cleared so that the selected entry is no longer evaluated for aging (see, Block 632). A check is then made to determine whether the selected entry is subject to reporting to the command host (e.g., NPU 0, NPU 1 or PCI), Block 640. This check can be performed by evaluating the corresponding bit position within the age report enable memory array 700*c*. Accordingly, even if a selected entry is identified at Block 637 as being subject to report-only aging at a global or per database level, the check at Block 640 may override these settings for a given entry.

If the aged entry is subject to reporting, then the age reporting enable setting for the entry is cleared, Block 641, and the address/index of the entry is added (i.e., "reported") to either FIFO 0 or FIFO 1, Block 642. The destination FIFO to which the aged entry is added is controlled by the value of the corresponding bit position within the age FIFO select memory array 700*d*. If the aged entry is reported to FIFO 0, then the identity of the aged out entry will ultimately be read from one of the memory mapped interfaces. Alternatively, if the aged entry is reported to FIFO 1, then the identity of the aged entry will ultimately be read from another one of the memory mapped interfaces. The timing of these read operations is a function of the timing of when the respective command hosts (e.g., NPU 0, NPU 1 or PCI), which issue the FIFO read instructions, receive corresponding interrupts that identify FIFO 0 or FIFO 1 as being sufficiently full. In the event FIFO 0 or FIFO 1 becomes completely full before being emptied by a command host, the instruction loading and execution logic 524 may operate to suspend age reporting or even operate to suspend all aging operations until such time as the age reporting FIFOs have been emptied.

The control circuit within the search engine device 500 may also be configured to fill FIFO 0 and FIFO 1 with the addresses of entries that have been aged out of other search engine devices. For example, when the illustrated search engine device 500 is configured as a master search engine device within a depth-cascaded search machine, the cascade interface 536 will operate to pass the indexes of aged out entries from one or more "slave" search engine devices to the aging FIFOs within the master search engine device. Accordingly, as illustrated by FIG. 8, a multi-chip search machine 800 may include a cascaded age reporting path that operates to pass the addresses/indexes of aged out entries along the cascaded chain of slave search engine devices (shown as NSE 1–NSE 7) to the cascade interface of the master search engine device (shown as NSE 0).

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. An integrated search engine device, comprising:
    a content addressable memory (CAM) core configured to support at least one database of searchable entries therein;
    a FIFO memory device configured to store addresses of entries that have been aged out of the at least one database and/or entries that have exceeded an activity-based aging threshold;
    a level count register configured to maintain a count of the stored addresses in said a FIFO memory device;
    a control circuit configured to support automatic generation of an interrupt to an interface of the search engine device and further configured to report the stored addresses from said FIFO memory device to the interface; and
    a level configuration register configured to maintain a threshold count value that specifies how many addresses can be stored in said FIFO memory device before said control circuit automatically generates the interrupt.

2. The device of claim 1, wherein said control circuit comprises a first memory device that is configured to store a plurality of age report enable bits that map to respective entries in the at least one database.

3. An integrated search engine device, comprising:
    a content addressable memory (CAM) core configured to support at least one database of searchable entries therein; and
    a control circuit configured to support generation of at least one interrupt to a command host in response to detecting a memory device containing a number of addresses of entries that have been aged out of the at least one database and/or addresses of entries that have exceeded an activity-based aging threshold that exceeds a threshold count value, which specifies how many addresses can be stored in the memory device before said control circuit is enabled to generate the at least one interrupt.

4. The device of claim 3, wherein said control circuit is further configured to support reporting of the addresses of the entries from the storage device to the command host, said reporting being programmable on a per entry basis.

5. The device of claim 3, wherein the memory device comprises a FIFO memory device.

6. The device of claim 5, wherein said control circuit further comprises:
    a level count register configured to maintain a count of unreported addresses in said FIFO memory device; and
    a level configuration register configured to maintain the threshold count value.

* * * * *